(12) United States Patent
Weng

(10) Patent No.: US 8,729,943 B2
(45) Date of Patent: May 20, 2014

(54) PHASE INTERPOLATING APPARATUS AND METHOD

(71) Applicant: MStar Semiconductor, Inc., Hsinchu County (TW)

(72) Inventor: Meng-Tse Weng, Hsinchu County (TW)

(73) Assignee: MStar Semiconductor, Inc., Hsinchu County (TW)

( * ) Notice: Subject to any disclaimer, the term of this patent is extended or adjusted under 35 U.S.C. 154(b) by 0 days.

(21) Appl. No.: 13/875,408

(22) Filed: May 2, 2013

(65) Prior Publication Data

US 2014/0021996 A1    Jan. 23, 2014

(30) Foreign Application Priority Data

Jul. 23, 2012 (TW) .............................. 101126458 A

(51) Int. Cl.
*H03H 11/16* (2006.01)
(52) U.S. Cl.
USPC ............................ 327/231; 327/235; 327/355
(58) Field of Classification Search
CPC ..... H03L 27/14; H03L 27/22; H03L 27/2273; H03L 27/2276; H03L 27/2332; H03L 27/142; H03L 27/144; H03L 27/1525; H03L 27/1563

USPC ......... 327/231, 235, 355, 356, 361, 403, 404; 375/329, 332, 334, 335
See application file for complete search history.

(56) References Cited

U.S. PATENT DOCUMENTS 6,753,712 B2 * 6/2004 Saeki ............................ 327/165
7,839,196 B2 * 11/2010 Yoon ............................ 327/231
7,912,167 B2 * 3/2011 Saeki ............................ 375/355

* cited by examiner

*Primary Examiner* — An Luu
(74) *Attorney, Agent, or Firm* — WPAT, PC; Justin King

(57) ABSTRACT

The present invention discloses a phase interpolating apparatus comprising: a first signal generation circuit, configured for generating a first signal having a first phase; an optional second signal generation circuit, configured for generating a second signal having the first phase; a third signal generation circuit, configured for generating a third signal having a second phase; a fourth/fifth signal generation circuit, configured for generating a fourth signal having a third phase when operating in a first mode and for generating a fifth signal having the second phase instead of the fourth signal when operating in a second mode; and a phase interpolator, configured for generating an interpolated signal without utilizing the fourth signal when operating in the first mode and for generating the interpolated signal according to the first signal, the third signal, and the fifth signal when operating in the second mode.

13 Claims, 8 Drawing Sheets

| Phase interpolating module | 401 | 403 | 405 | 407 | phase of CIS | output of multiplexer 309 |
|---|---|---|---|---|---|---|
| Input signal & phase | $CS_1 (P_0)$ | $CS_2 (P_0)$ | $CS_3 (P_1)$ | $CS_4 (P_9)$ or $CS_5 (P_1)$ | | |
| State "A" | 11 | 11 | 00 | 00 | $4/4P_0$ | $CS_4 (P_9)$ |
| State "B" | 01 | 11 | 10 | 00 | $3/4P_0 + 1/4P_1$ | $CS_4 (P_9)$ |
| State "C" | 00 | 11 | 11 | 00 | $2/4P_0 + 2/4P_1$ | $CS_4 (P_9) \rightarrow CS_5 (P_1)$ |
| State "D" | 00 | 01 | 11 | 10 | $1/4P_0 + 3/4P_1$ | $CS_5 (P_1)$ |
| State "E" | 00 | 11 | 11 | 00 | $2/4P_0 + 2/4P_1$ | $CS_5 (P_1) \rightarrow CS_4 (P_9)$ |

FIG. 5

| State | Phase of input signal 401 | Phase of input signal 403 | Phase of input signal 405 | Phase of input signal 407 |
|---|---|---|---|---|
| 1 | $P_0$ | $P_0$ | $P_1$ | $P_9$ |
| 2 | $P_0$ | $P_0$ | $P_1$ | $P_9$ |
| 3 | $P_0$ | $P_0$ | $P_1$ | $P_1$ |
| 4 | $P_0$ | $P_0$ | $P_1$ | $P_1$ |
| 5 | $P_0$ | $P_2$ | $P_1$ | $P_1$ |
| 6 | $P_0$ | $P_2$ | $P_1$ | $P_1$ |
| 7 | $P_2$ | $P_2$ | $P_1$ | $P_1$ |
| 8 | $P_2$ | $P_2$ | $P_1$ | $P_1$ |
| 9 | $P_2$ | $P_2$ | $P_3$ | $P_1$ |
| 10 | $P_2$ | $P_2$ | $P_3$ | $P_1$ |
| 11 | $P_2$ | $P_2$ | $P_3$ | $P_3$ |
| 12 | $P_2$ | $P_2$ | $P_3$ | $P_3$ |
| 13 | $P_4$ | $P_2$ | $P_3$ | $P_3$ |
| 14 | $P_4$ | $P_2$ | $P_3$ | $P_3$ |
| 15 | $P_4$ | $P_4$ | $P_3$ | $P_3$ |
| 16 | $P_4$ | $P_4$ | $P_3$ | $P_3$ |
| 17 | $P_4$ | $P_4$ | $P_5$ | $P_3$ |
| 18 | $P_4$ | $P_4$ | $P_5$ | $P_3$ |
| 19 | $P_4$ | $P_4$ | $P_5$ | $P_5$ |
| 20 | $P_4$ | $P_4$ | $P_5$ | $P_5$ |
| 21 | $P_6$ | $P_4$ | $P_5$ | $P_5$ |
| 22 | $P_6$ | $P_4$ | $P_5$ | $P_5$ |

FIG. 6

PHASE INTERPOLATING APPARATUS AND METHOD

CROSS REFERENCE TO RELATED APPLICATIONS

This application claims priority under 35 U.S.C 119 to Taiwan patent application, TW101126458, filed on Jul. 23, 2012, the disclosure of which is incorporated herein by reference.

BACKGROUND OF THE INVENTION

1. Field of the Invention

The present invention relates to a phase interpolating apparatus and associated phase interpolating method, and more particularly, to a phase interpolating apparatus and method capable of predicting interpolation and switching phase to be interpolated in advanced.

2. Description of the Prior Art

A phase interpolating apparatus is widely used in modern electronics because it is used to generate multiple clock signals having different phases based on few clock signals. Please refer to FIG. 1, which illustrates a block diagram of a phase interpolating apparatus 100 in the prior art. As shown in FIG. 1, the phase interpolating apparatus 100 in the prior art comprises a phase interpolator 101 and multiplexers (denoted as Mux in abbreviation) 103 and 105. The multiplexer 103 is used to receive input clock signals $CLK_0$, $CLK_2$, $CLK_4$, and $CLK_6$ having different even phases $P_0$, $P_2$, $P_4$, and $P_6$, respectively, and is also used to select one of the inputs to the phase interpolator 101. Similarly, the multiplexer 105 is used to receive input clock signals $CLK_1$, $CLK_3$, $CLK_5$, and $CLK_7$ having different odd phases $P_1$, $P_3$, $P_5$, and $P_7$, respectively, and is also used to select one of the inputs to the phase interpolator 101. The phase interpolator 101 is used to generate an interpolated clock signal CIS according to the received clock signals.

However, when a traditional phase interpolating apparatus switches clock signals to be interpolated, an unexpected voltage pulse is sometimes generated. Please refer to FIG. 2, which depicts a diagram for explaining how voltage pulse is generated in the prior art. In the example shown in FIG. 2, the phase interpolating apparatus 100 generates the interpolated clock signal CIS based on the clock signal $CLK_0$ having phase $P_0$ at the upper side and the clock signal $CLK_1$ having phase $P_1$ at the lower side at first. Then the phase interpolating apparatus 100 switches to the clock signal $CLK_2$ from the clock signal $CLK_0$ to generate the interpolated clock signal CIS with the clock signal $CLK_1$. As shown in FIG. 2(a), the interpolated clock signal CIS at timing points $T_1$, $T_2$, $T_3$, and $T_4$ are interpolated according to the clock signals $CLK_0$ and $CLK_1$ at the same timing points $T_1$, $T_2$, $T_3$, and $T_4$.

As shown in FIG. 2(b), at the moment that the clock signal at the upper side to be interpolated is switched from the clock signal $CLK_0$ having phase $P_0$ to the clock signal $CLK_2$ having phase $P_2$, a temporary transition state is generated because of the switch transition. In this temporary transition state, value of the clock signal $CLK_0$ would be residuary and cause the interpolated clock signal CIS to display error. For example, at the timing point $T_2$ shown in FIG. 2(b), the voltage level of the clock signal $CLK_2$ is low and so is the clock signal $CLK_1$, the voltage level of the interpolated clock signal CIS should be low accordingly. But the clock signal $CLK_0$ is residuary (represented by dashed line). Moreover, the voltage level of the clock signal $CLK_0$ at timing point $T_2$ is high. Therefore a voltage pulse P would be interpolated as the interpolated clock signal CIS at timing point $T_2$. Even though value of the interpolated clock signal CIS is correct after timing point $T_2$, the voltage pulse P effects accuracy overall. Please refer to FIG. 2(c), the upper input signal is switched to the clock signal $CLK_2$ after timing point $T_2$, correct values of interpolated clock signal can be read at timing points $T_3$ and $T_4$. However, the voltage pulse P which appeared at the timing point $T_2$ cause un-recoverable errors. Such errors make the interpolated clock signal display un-normal surge or decays, so the waveform becomes incorrect.

In order to solve the above problem, several solutions were already provided in the prior art. One of these solutions is to wait a predetermined time interval after the switch, and then generate the interpolated clock signal. However, the processing speed is slower in this configuration, and more complicated logic circuits are needed to control the switch and the interpolation separately.

SUMMARY OF THE INVENTION

One of objectives of the present invention is to provide a phase interpolating apparatus and a phase interpolating method preventing voltage pulse problems in the prior art.

An embodiment of the present invention discloses a phase interpolating apparatus comprising: a first signal generation circuit, configured for generating a first signal having a first phase; an optional second signal generation circuit, configured for generating a second signal having the first phase; a third signal generation circuit, configured for generating a third signal having a second phase; a fourth/fifth signal generation circuit, configured for generating a fourth signal having a third phase at a first mode and for generating a fifth signal having the second phase instead of the fourth signal at a second mode; and a phase interpolator, configured for generating an interpolated signal without utilizing the fourth signal operating in the first mode and for generating the interpolated signal according to the first signal, the third signal, and the fifth signal operating in the second mode.

Based on the aforementioned embodiment, a corresponding phase interpolating method can be concluded accordingly. Since the steps of the phase interpolating method are also derived from the embodiment above, no further description is elaborated here.

According to the described embodiments, switching input signals in advance according to a prediction result of the next phase to be interpolated is embodied to prevent voltage pulse problems experienced in the prior art and to maintain processing speed. Also, sharing multiplexers and phase interpolating modules enable circuit area to be saved accordingly.

The above description is only an outline of the technical schemes of the present invention detailed below. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein:

FIG. 5 shows an operating diagram of a phase interpolating apparatus according to one embodiment of the present invention.

FIG. 6 depicts a diagram of phase sequence of clock signal for generating the interpolated clock signal.

DETAILED DESCRIPTION OF THE PREFERRED EMBODIMENTS

Figure 1:
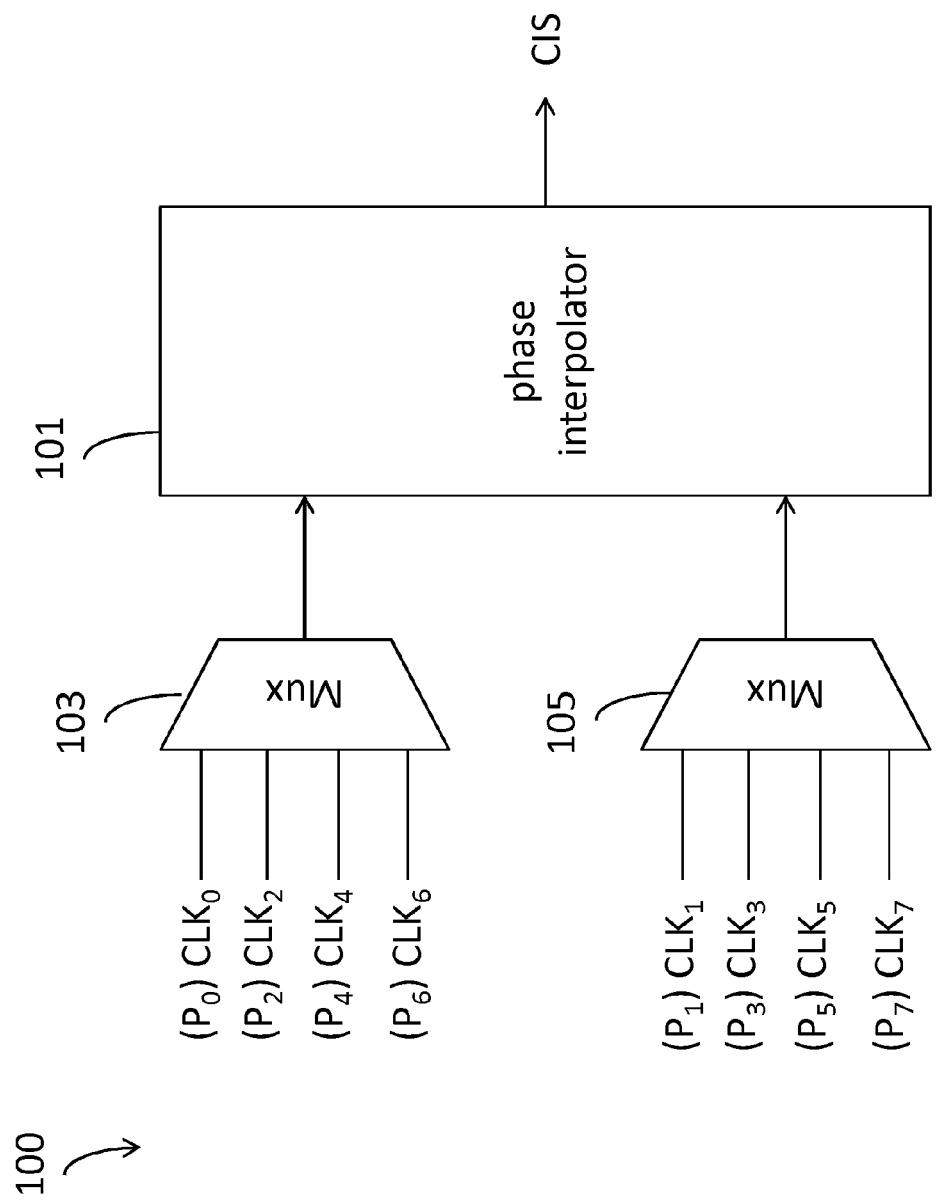
FIG. 1 illustrates a block diagram of a phase interpolating apparatus in the prior art.
Figure 2:
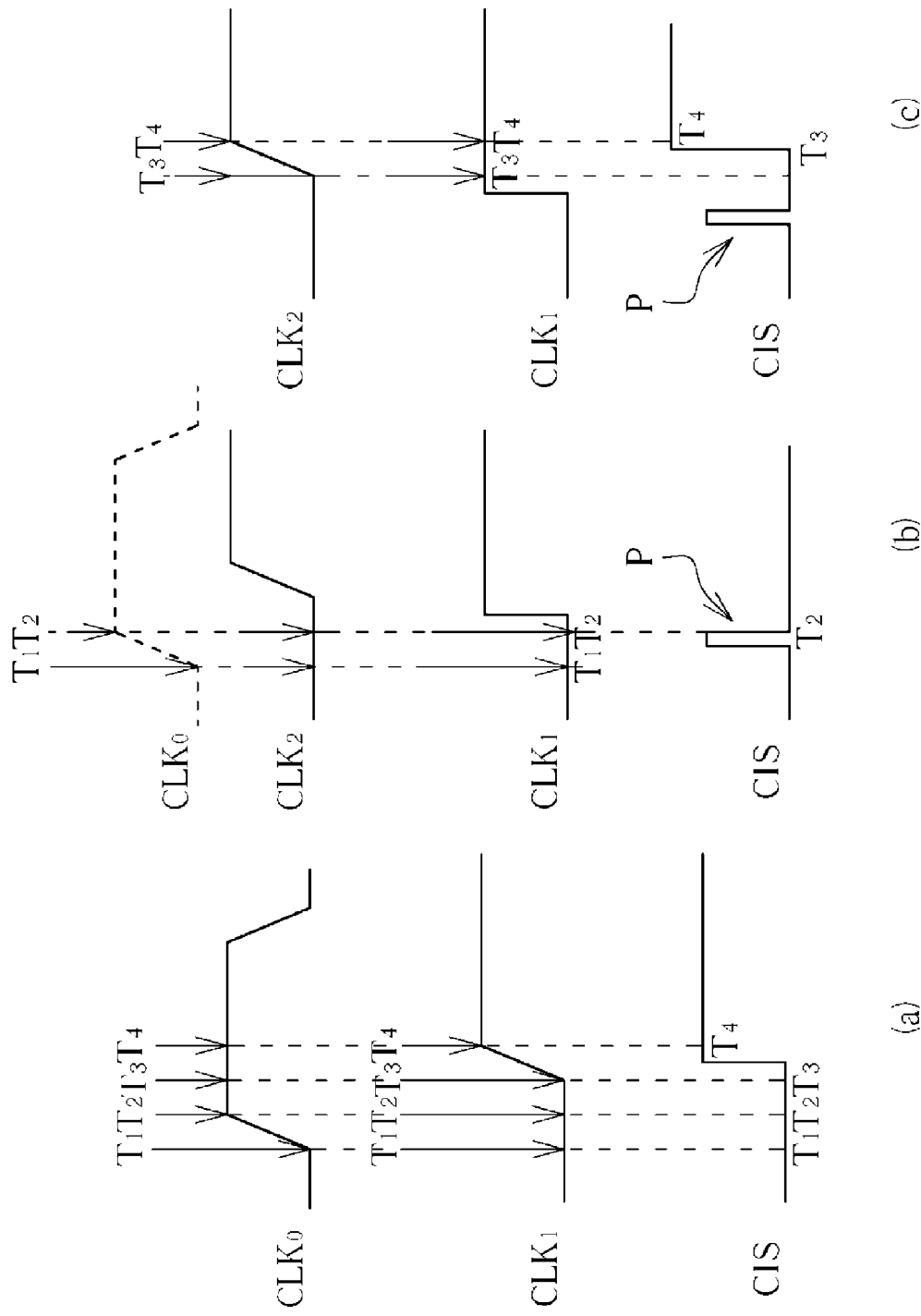
FIG. 2 depicts a diagram explaining how a voltage pulse is generated in the prior art.
Figure 3:
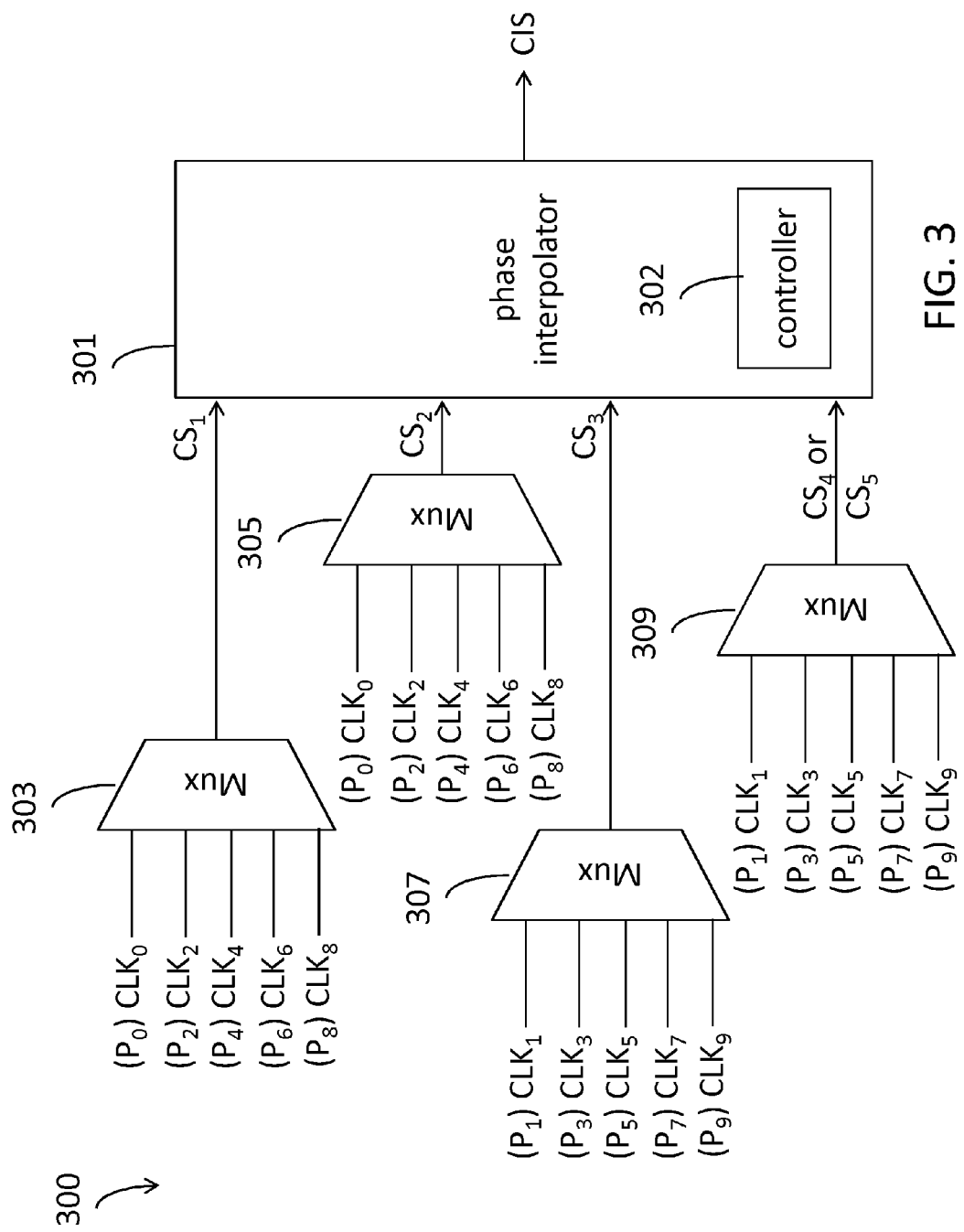
FIG. 3 shows a block diagram of a phase interpolating apparatus in accordance with an embodiment of the present invention.

Please refer to FIG. 3, which shows a block diagram of a phase interpolating apparatus 300 in accordance with an embodiment of the present invention. As shown in FIG. 3, clock signals $CLK_0$, $CLK_2$, $CLK_4$, $CLK_6$, and $CLK_8$ have even phases $P_0$, $P_2$, $P_4$, $P_6$, and $P_8$, respectively. Similarly, clock signals $CLK_1$, $CLK_3$, $CLK_5$, $CLK_7$, and $CLK_9$ have odd phases $P_1$, $P_3$, $P_5$, $P_7$, and $P_9$, respectively. The phase interpolating apparatus 300 comprises a phase interpolator 301 and multiplexers 303, 305, 307, and 309. The multiplexers 303 and 305 receive clock signals $CLK_0$, $CLK_2$, $CLK_4$, $CLK_6$, and $CLK_8$ and output a first clock signal $CS_1$ and a second clock signal $CS_2$ to the phase interpolator 301, respectively. The multiplexer 307 receives clock signals $CLK_1$, $CLK_3$, $CLK_5$, $CLK_7$, and $CLK_9$ and outputs a third clock signal $CS_3$ to the phase interpolator 301. The multiplexer 309 receives clock signals $CLK_1$, $CLK_3$, $CLK_5$, $CLK_7$, and $CLK_9$ and outputs a fourth clock signal $CS_4$ or a fifth clock signal $CS_5$ to the phase interpolator 301 at a first mode or at a second mode, respectively. The third clock signal $CS_3$ and the fifth clock signal $CS_5$ have the same phase. In the first mode, the phase interpolator 301 need not utilize the fourth clock signal $CS_4$ to generate the interpolated clock signal CIS. Instead, the phase interpolator 301 utilizes at least two of the first clock signal $CS_1$, the second clock signal $CS_2$, and the third clock signal $CS_3$ to generate the interpolated clock signal CIS in the first mode. In the second mode, the phase interpolator 301 utilizes the first clock signal $CS_1$, the second clock signal $CS_2$, the third clock signal $CS_3$, and the fifth clock signal $CS_5$ to generate the interpolated clock signal CIS. Operating details of the phase interpolating apparatus 300 are described below.

Figure 4A:
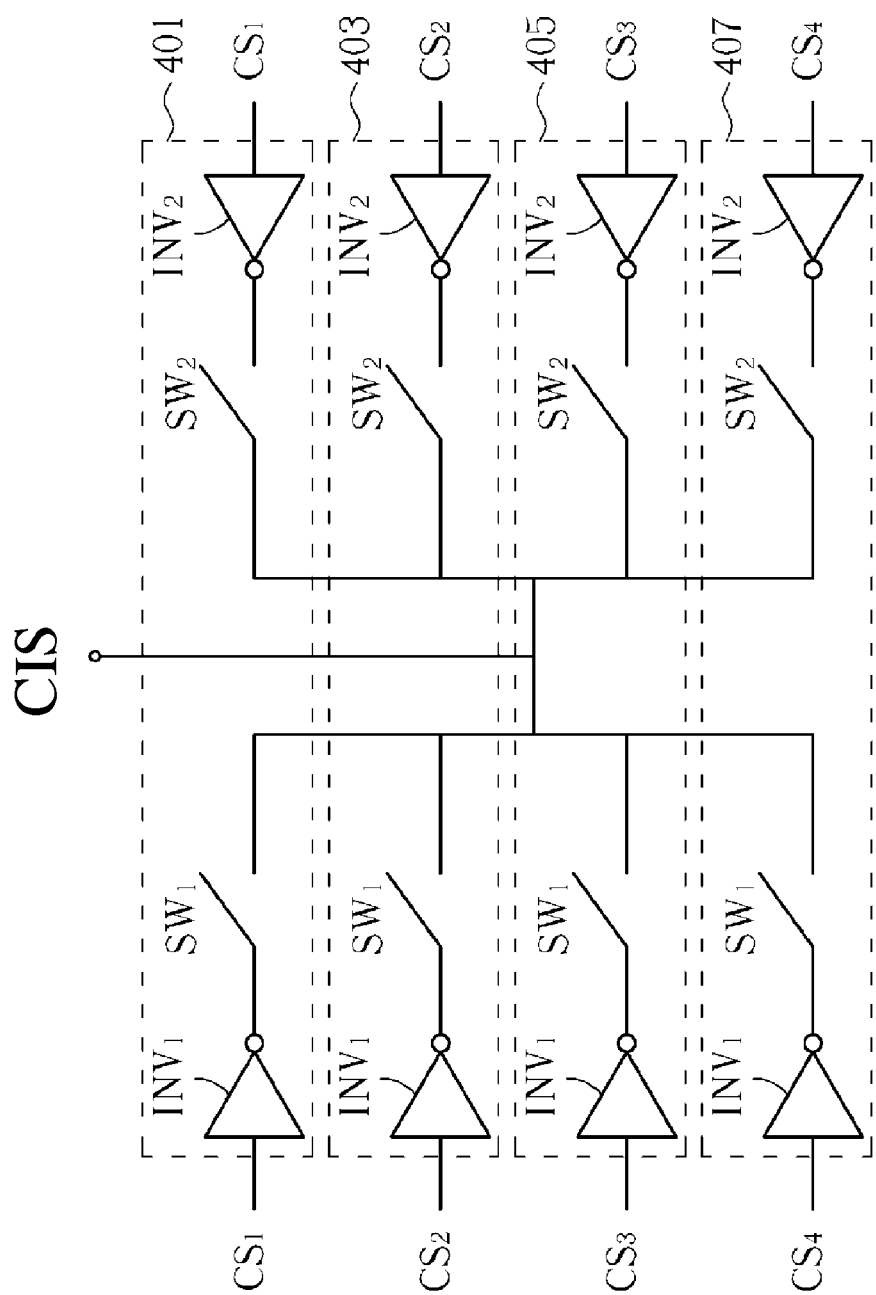
FIGS. 4A and 4B illustrate an exemplary logic circuit structure of the phase interpolator shown in FIG. 3.
Figure 4B:
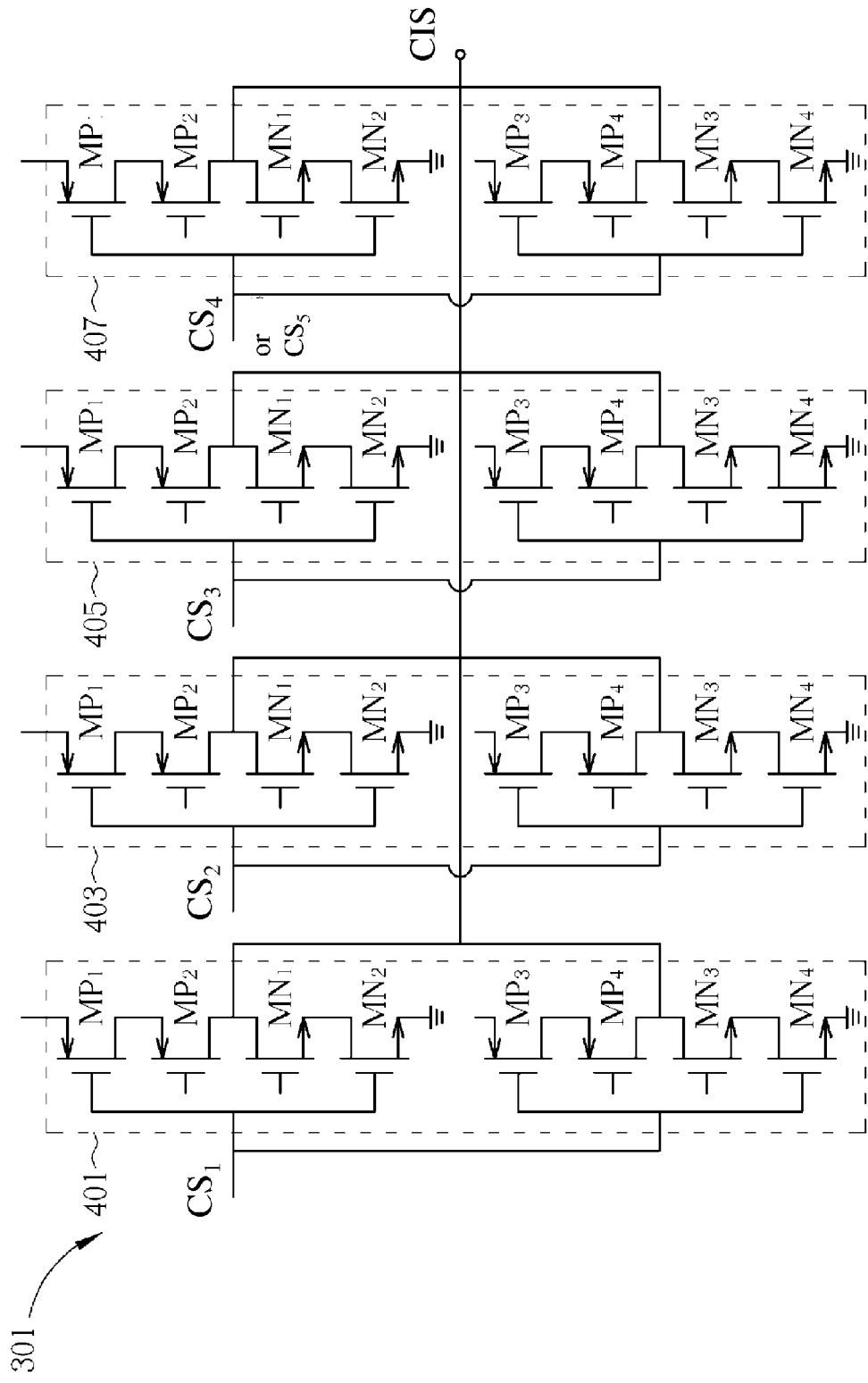

The phase interpolator 301 may be implemented by various structures of logical circuits. Please refer to FIGS. 4A and 4B, which illustrate an exemplary logic circuit structure of the phase interpolator 301 shown in FIG. 3. As shown in FIG. 4A, the phase interpolator 301 includes phase interpolating modules 401, 403, 405, and 407. Each of the phase interpolating modules comprises phase inverters $INV_1$ and $INV_2$ and switches $SW_1$ and $SW_2$. Switches $SW_1$ and $SW_2$ are used to control which input signals are utilized to be interpolated. Signal outputs of the phase interpolating modules 401, 403, 405, and 407 are coupled. FIG. 4B depicts more details of logic circuit structure shown in FIG. 4A. As shown in FIG. 4B, each of the phase interpolating modules includes multiple P-MOSFET (Positive Metal Oxide Semiconductor Field Effect Transistors): $MP_1$, $MP_2$, $MP_3$, and $MP_4$, as well as multiple N-MOSFET: $MN_1$, $MN_2$, $MN_3$, and $MN_4$. These P-MOSFET and N-MOSFET are connected in serial. Outputs are coupled to a joint of $MP_2$ and $MN_1$ and to a joint of $MP_4$ and $MN_3$. Functionally, P-MOSFET $MP_1$ and N-MOSFET $MN_2$ shown in FIG. 4B are equivalent to the phase inverter $INV_1$ shown in FIG. 4A. P-MOSFET $MP_2$ and N-MOSFET $MN_1$ shown in FIG. 4B are equivalent to the switch $SW_1$ shown in FIG. 4A. Similarly, P-MOSFET $MP_3$ and N-MOSFET $MN_4$ shown in FIG. 4B are equivalent to the phase inverter $INV_2$ shown in FIG. 4A. P-MOSFET $MP_4$ and N-MOSFET $MN_3$ shown in FIG. 4B are equivalent to the switch $SW_2$ shown in FIG. 4A. Ordinary skilled in the art should understand detailed structure and operating sequence of the phase interpolator 301. No further descriptions are discussed here.

The following paragraphs describe operations of the phase interpolating apparatus 300. FIG. 3, FIG. 4A, and FIG. 5 may be referred to for better understanding of the present invention. The example shown in FIG. 5 assumes that the first clock signal $CS_1$ having phase $P_0$ (the multiplexer 303 outputs clock signal $CLK_1$ as the first clock signal $CS_1$), the second clock signal $CS_2$ having phase $P_0$, the third clock signal $CS_3$ having phase $P_1$, the fourth clock signal $CS_4$ having phase $P_9$, and the fifth clock signal $CS_5$ having phase $P_1$. However, these assumptions should not be used to specifically limit the scope of the present invention. The parameters 00, 01, 11, and 10 shown in FIG. 5 represent the internal switch states of the phase interpolating modules 401, 403, 405, and 407, respectively. Taking the phase interpolating module 401 as an example, the switch state 00 represents switches $SW_1$ and $SW_2$ are opened. In contrary, the switch state 11 denotes switches $SW_1$ and $SW_2$ are closed. The switch state 10 represents the switch $SW_1$ is closed and the switch $SW_2$ is opened. And the switch state 01 represents the switch $SW_1$ is opened and the switch $SW_2$ is closed.

Please refer to FIG. 5 again. At state "A" shown in FIG. 5, the switch states of the phase interpolating modules 401, 403, 405, and 407 are 11, 11, 00, 00, respectively. The phase of interpolated clock signal CIS is $$\frac{4}{4}P_0.$$

The output of the multiplexer 309 is the fourth clock signal $CS_4$ having phase $P_9$ which is not used to generate the interpolated clock signal CIS. Hence, the fourth clock signal $CS_4$ is idle or used by other circuits at the moment. At state "B" shown in FIG. 5, the switch states of the phase interpolating modules 401, 403, 405, and 407 are 01, 11, 10, and 00, respectively. The phase of interpolated clock signal CIS is $$\frac{3}{4}P_0 + \frac{1}{4}P_1.$$

The output of the multiplexer 309 is again the fourth clock signal $CS_4$ having phase $P_9$ which is not utilized to generate the interpolated clock signal CIS. At state "C" shown in FIG. 5, the switch states of the phase interpolating modules 401, 403, 405, and 407 are 00, 11, 11, and 00, respectively. The output of the multiplexer 309 is the fourth clock signal $CS_4$ have phase $P_9$. At this state "C", a controller 302 in the phase interpolator 301 predicts that the next phase of the interpolated clock signal CIS is $$\frac{1}{4}P_0 + \frac{3}{4}P_1$$

according to stored phase sequence (details will be described in reference to FIG. 6). Two clock signals having phase $P_1$ are required to generate the interpolated clock signal CIS. Therefore the multiplexer 309 is controlled to cease outputting the fourth clock signal $CS_4$ and to start outputting the fifth clock signal $CS_5$.

At state "D", the switch states of the phase interpolating modules 401, 403, 405, and 407 are 00, 01, 11, and 10, respectively. At this moment, the phase interpolating module 407 receives the fifth clock signal $CS_5$ having phase $P_1$. As a result, the phase of the interpolated clock signal CIS is $$\frac{1}{4}P_0 + \frac{3}{4}P_1$$

as predicted. The state "E" is as the same as the state "C". The switch states of the phase interpolating modules 401, 403, 405, and 407 are 00, 11, 11, and 00, respectively. At this moment, the phase interpolating module 407 still receives the fifth clock signal $CS_5$ having phase $P_1$. Therefore the phase of the interpolated clock signal CIS is $$\frac{2}{4}P_0 + \frac{2}{4}P_1.$$

In this circumstance, the controller 302 predicts that next phase of the interpolated clock signal CIS is $$\frac{3}{4}P_0 + \frac{1}{4}P_1.$$

It does not need two clock signals having phase $P_1$ to generate the interpolated clock signal CIS. In consequence, the multiplexer 309 is controlled to cease outputting the fifth clock signal $CS_5$ and to start outputting the fourth clock signal $CS_4$. It is worthy to note that the sequence of states above can be changed and without departing from the spirit of the present invention. It is not required to precisely follow the state sequence specifically shown in FIG. 5.

Please refer to FIG. 6, which depicts a diagram of the phase sequence of clock signals for generating the interpolated clock signal. The states 1, 2, 3, and 4 shown in FIG. 6 are corresponding to the states A, B, C, and D shown in FIG. 5, respectively. The dotted cells shown in FIG. 6 are phases utilized to generate the interpolated clock signal. However, the states after the state 4 shown in FIG. 6 are not consistent to the states after the state "D" shown in FIG. 5. At state "E" shown in FIG. 5, phase received by the phase interpolating module 407 changes from $P_1$ to $P_9$. But at the state 5 shown in FIG. 6, the phase received by the phase interpolating module 407 is still $P_1$. In other words, the phase sequence of clock signals utilized to generate interpolated clock signal can be changed at will. According to such a configuration, the controller circuit is able to predict phase of the next stage and determine if the phase is needed to be switched. For example, when state 8 is going to be changed to state 9 shown in FIG. 6, it is predicted at state 8 that phase outputted from the phase interpolating module 405 is not required. Therefore the output of the multiplexer 309 could be switched from clock signal having phase $P_1$ to clock signal having phase $P_3$. According to the embodiments shown in FIG. 5 and FIG. 6, the sequence of states is not fixed. The phase sequence utilized to generate the interpolated clock signal could be arranged in advanced. In addition, phase of the next stage could be predicted according to the current phase sequence and the predicted result is used to determine whether output of multiplexer needs to be switched.

Please be aware that the scope of the present invention is not specifically limited to the aforementioned embodiments. For example, the phase interpolating apparatus 300 can be used to generate signals other than clock signals. Besides, in the embodiment shown in FIG. 5, it is not required to have two clock signals having the same phase (e.g., $CS_1$ and $CS_2$). In other words, the phase interpolating apparatus 300 may only equipped with the multiplexers 303, 307 and 309 and without the multiplexer 305. Moreover, the multiplexers 303, 305, 307, and 309 shown in FIG. 3 are not restricted to receive one sort of odd phases and even phases. Besides, the multiplexers 303, 305, 307, and 309 may be replaced by any other signal generation circuits. As long as the circuit is able to produce signal with required phase to the phase interpolator, it is fallen into the scope of the present invention. Furthermore, the aforementioned prediction of next phase to generate the interpolated clock signal can be achieved by any methods other than stored phase sequence in advance. The phase sequences shown in FIG. 5 and FIG. 6 can be altered to adopt any other needs. Thus, the scope of the present invention is not specifically limited to the embodiments shown in FIG. 5 and FIG. 6.

Figure 7:
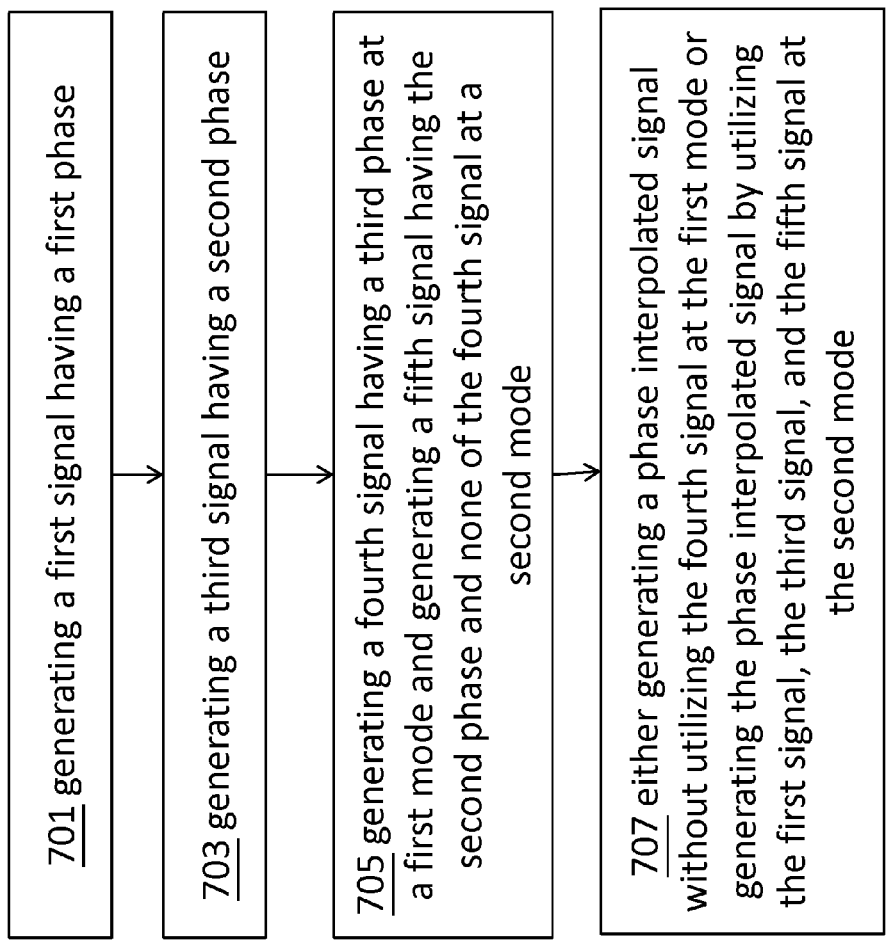
FIG. 7 illustrates a flowchart diagram of a phase interpolating method in accordance with an embodiment of the present invention.

Based on the aforementioned embodiments, a phase interpolating method is concluded as following the steps shown in FIG. 7.

Step 701: generating a first signal having a first phase (e.g., $CS_1$).

Step 703: generating a third signal having a second phase (e.g., $CS_3$).

Step 705: generating a fourth signal having a third phase (e.g., $CS_4$) at a first mode and generating a fifth signal having the second phase (e.g., $CS_5$) instead of the fourth signal at a second mode.

Step 707: either generating a phase interpolated signal without utilizing the fourth signal at the first mode (e.g., state "A", "B", and "C" shown in FIG. 5) or generating the phase interpolated signal by utilizing the first signal, the third signal, and the fifth signal at the second mode (e.g., state "D" shown in FIG. 5.)

According to the described embodiments, switching input signals in advance according to a prediction result of the next phase to be interpolated is embodied to prevent voltage pulse problems present in the prior art and to maintain original processing speed of prior art interpolating devices. Additionally, sharing multiplexers and phase interpolating modules enable circuit area to be saved accordingly.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A phase interpolating apparatus comprises:
a first signal generation circuit, configured for generating a first signal having a first phase;
a third signal generation circuit, configured for generating a third signal having a second phase;
a fourth/fifth signal generation circuit, configured for generating a fourth signal having a third phase when operating in a first mode and for generating a fifth signal having the second phase when operating in a second mode; and a phase interpolator, configured for generating an interpolated signal without utilizing the fourth signal when operating in the first mode and for generating the interpolated signal according to the first signal, the third signal, and the fifth signal when operating in the second mode.

2. The phase interpolating apparatus of claim 1, wherein the phase interpolator is further configured for generating the interpolated signal according to the first signal and the third signal when operating in the first mode.

3. The phase interpolating apparatus of claim 1 further comprises:
    a second signal generation circuit, configured for generating a second signal having the first phase,
    wherein the phase interpolator is further configured for generating the interpolated signal according to at least two of the first signal, the second signal, and the third signal when operating in the first mode and for generating the interpolated signal according to one of the first signal and the second signal, the third signal, and the fifth signal when operating in the second mode.

4. The phase interpolating apparatus of claim 1 further comprises a control circuit configured for predicting whether the phase interpolating apparatus is required to utilize the fifth signal for generating the interpolated signal, wherein the fourth/fifth signal generation circuit is switched to generate the fifth signal instead of the fourth signal in advance of the interpolated signal being generated if the control circuit determines that the phase interpolating apparatus is required to utilize the fifth signal for generating the interpolated signal.

5. The phase interpolating apparatus of claim 4, wherein a phase sequence of signals is stored in the phase interpolating apparatus and is utilized to generate the interpolated signal, and wherein predicting whether the phase interpolator is required to utilize the fifth signal for generating the interpolated signal is made according to the phase sequence.

6. The phase interpolating apparatus of claim 1, wherein the first phase is odd phase and the second and third phases are even phase.

7. The phase interpolating apparatus of claim 6, wherein the first signal generation circuit, the third signal generation circuit, and the fourth/fifth signal generation circuit are multiplexers, wherein the first signal generation circuit receives input signals having even phases, and the third signal generation circuit and the fourth/fifth signal generation circuit receive input signals having odd phases.

8. A phase interpolating method comprises:
    generating a first signal having a first phase;
    generating a third signal having a second phase;
    generating a fourth signal having a third phase when operating in a first mode and generating a fifth signal having the second phase instead of the fourth signal when operating in a second mode; and
    either generating an interpolated signal without utilizing the fourth signal at the first mode or generating the interpolated signal according to the first signal, the third signal, and the fifth signal when operating in the second mode.

9. The phase interpolating method of claim 8, wherein the interpolated signal is generated only according to the first signal and the third signal when operating in the first mode.

10. The phase interpolating method of claim 8 further comprises:
    generating a second signal having the first phase; and
    wherein the interpolated signal is generated according to at least two of the first signal, the second signal, and the third signal at the first mode or the interpolated signal is generated according to one of the first signal and the second signal, the third signal, and the fifth signal when operating in the second mode.

11. The phase interpolating method of claim 8 further comprises:
    predicting whether it is required to utilize the fifth signal for generating the interpolated signal; and
    generating the fifth signal instead of the fourth signal in advanced of the interpolated signal is generated if it is required to utilize the fifth signal for generating the interpolated signal.

12. The phase interpolating method of claim 11 further comprises:
    predicting whether it is required to utilize the fifth signal for generating the interpolated signal according to a phase sequence, wherein the phase sequence is predetermined.

13. The phase interpolating method of claim 8, wherein the first phase is one of odd phase and even phase and the second and third phases are the other phase.

* * * * *